United States Patent [19]
Jung et al.

[11] 4,443,060
[45] Apr. 17, 1984

[54] RUN-FREE COLOR RASTER FOR MULTI-COLOR PRINTING

[75] Inventors: Eggert Jung, Schoenberg; Heinrich Wadle, Neumuenster, both of Fed. Rep. of Germany

[73] Assignee: Dr. -Ing. Rudolf Hell GmbH, Fed. Rep. of Germany

[21] Appl. No.: 341,486

[22] Filed: Jan. 21, 1982

[30] Foreign Application Priority Data

Jan. 24, 1981 [DE] Fed. Rep. of Germany ....... 8110052

[51] Int. Cl.³ .............................................. G02B 5/20
[52] U.S. Cl. .................................. 350/317; 350/322; 430/6
[58] Field of Search ..................... 350/322, 317; 430/6

[56] References Cited
FOREIGN PATENT DOCUMENTS 1112407 2/1962 Fed. Rep. of Germany .

OTHER PUBLICATIONS

Baar, Walter, "Electronic Cylinder Gravure for Polychromatic Rotogravure", from Polygraph, No. 18, 1965, p. 2, Paragraphs 3 through 7.
Druck-Print, No. 12, 1968, pp. 932, 934, 935.
Deutscher Drucker, No. 22-24/1974, p. 5.

*Primary Examiner*—John K. Corbin
*Assistant Examiner*—Paul M. Dzierzynski
*Attorney, Agent, or Firm*—Hill, Van Santen, Steadman & Simpson

[57] ABSTRACT

In engraving of printing forms particularly of gravure cylinders, it has previously been possible to produce run-free color raster configurations for only two colors. The present invention discloses rastering methods for run-free color production of four color impressions and polychromatic impressions.

3 Claims, 2 Drawing Figures

RUN-FREE COLOR RASTER FOR MULTI-COLOR PRINTING

BACKGROUND OF THE INVENTION

1. Field of The Invention

The invention relates to a screening method for multicolor printing wherein raster elements are produced point or line-wise in chronological succession by engraving, exposure or electro-mechanically by means of high energy radiation or electro-optically wherein the types of raster utilized in both the line spacings in the various rasters of a set-up color separation have ratios of approximately small rational numbers and the raster point spacings within the lines of the set of rasters have ratios of approximately small rational numbers and wherein the number of raster points per surface area can be different in the rasters for the different individual colors.

2. Description of the Prior Art

In the art of electronic mechanical engraving of printing forms as, for example, in the engraving of gravure cylinders it has been described in detail in "Der Polygraph", No. 18/1965; "Deutscher Drucker", No. 22-24/1974 and "Druck-Print", 12/68, pp. 931 through 938, the problem arises that in order to avoid Moire effects, an angling between the screens of the individual colors of a multi-color printing used in standard conventionally etched autotype forms cannot be accomplished.

Primarily this is because the raster grid of an engraving for example of a gravure cylinder is formed by means of successively engraving all of the raster points such that the engraving head operating with a constant rastering frequency of its engraving tool engraves one axial extending line of the cylinder after another with raster cups of different depths but with constant center spacings from each other. Thus, the engraving head continuously moves slowly or step-by-step in the axial direction of the cylinder on the respective axial line spacing per cylinder revolution which is prescribed for the desired raster.

Thus, the raster grid results from the interaction between the rotary motion of the drum, the forward feed of the engraving tool in the axial direction of the cylinder and the rastering frequency of the engraving tool. It is obvious that the geometry of the raster grid is based on the circumferential spacing and the forward feed direction as specified directions and that an angled position of the raster grid relative to the circumferential direction which is the subsequent direction of the run of paper during printing cannot occur. Since the number of cups on a given circumference as well as the length unit in the axial direction is extremely precise, Moire phenomena cannot occur even given non-angled rasters because Moire patterns result because raster points of two or more rasters are printed on top of one another or next to one another at periodically repeating intervals.

In practice, however, a number of meters or yards of the paper which are to be printed may be present between two printing units of a printing machine and the paper can easily change its length by one-half of a raster point spacing due to stretching and shrinking due to moistening and dilatation between the printing units. As a result, the raster points of two or more colors may be accidentally printed on top of each other or be printed so close next to each other to obtain so-called color drift and these effects also cause Moire effects which are statistically much greater so that impressions of the same subject printed from various cylinder impressions have great color fluctuations which cannot in practice be accepted.

It should also be noted that the standard angling of the rasters utilized in conventional practice does not cause the Moire to disappear. On the contrary, as a result of angling, the Moire is made so fine that its mesh is only slightly greater than the mesh of the raster itself. Thus, due to the finite power of resolution of the human eye at a reading distance, it will no longer be perceptible if a sufficiently fine screen is used.

Since the existence of electro-mechanical engraving particularly of gravure form cylinders, it has become desirable to obtain raster geometries to produce forms which are equivalent in effect to conventional angling.

A type of raster distortion in the engraving using a suitable selection of the raster production parameters has been disclosed in German LP 1,112,407 (also in "Druck-Print" 12/68, pp. 931–938 also). The same effect as in "angling" is created by means of "crushing" or "elongating" the originally quadratic raster meshes in specific numerical ratios. However, it was not observed at the time of this work that there are only two practical combinations of raster geometries which meet the conditions desired which are that in the circumferential direction that three raster points of the second raster occur for two raster points of the first raster and vice-versa in the forward-feed direction that three raster points of the first raster occur for two raster points of the second raster. Compare FIG. 2b in German LP 1,112,407. In four-color printing, all of the combinations produce an unacceptable Moire effect.

SUMMARY OF THE INVENTION

For a long period of time, when printing four colors in combination operators printed the critical colors usually red and blue in one of the respective raster geometries. These were free of color drift and the Moire which occurred was sufficiently fine. The remaining colors black and yellow are not quite as sensitive relative to color drift and were therefore respectively assigned to one of the two raster geometries. The color drift with red and blue was acceptable but was always a critical point for the engraved printing forms. Since then, the object has occurred of finding combinations of the raster configurations which allow more than two colors to be printed free of color drift and with a sufficiently small Moire effect. Further, such configurations must also be adaptable and useable in the standard machines of reproduction technology which existed today whether they be engraving machines or scanners. The present invention has an object of disclosing a method of rastering which accomplishes these results.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

The invention comprises printing the raster configurations together which are to be varied not only by distorting them from the original quadratic shape, but also in the raster amplitude, in other words, in the actual number of raster elements per surface unit. The inventors have discovered that a great many more combinations can be used than the ratio of 2:3/3:2 which is disclosed in German LP 1,112,407. It has been discovered that even noticeable deviations from a basic raster amplitude for the various colors do not result in a noticeable sacrifice in quality particularly when the deviation is in the direction toward finer screens. It has been discovered that using these preconditions that precise rational ratios in the "elongation" or "compression" of the quadratic original rasters need not be utilized. Slight deviations from the determined configuration do not result in color drift but rather only change the fine Moire effect to an extremely small degree and phase position, mesh shape and period. As examples of the invention, two practical configurations for a four-colored high-grade catalog gravure may be cited.

Figure 1:
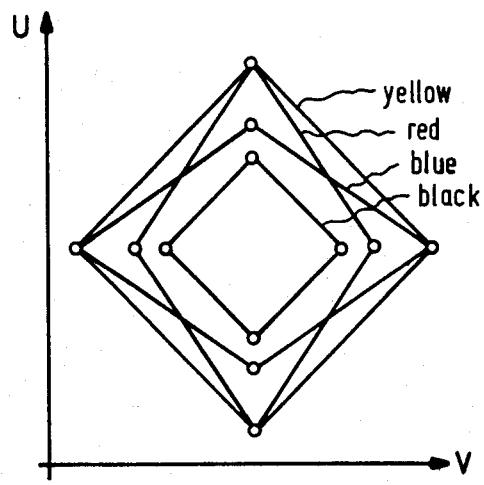
FIG. 1 is a schematic illustration of the arrangement of the raster points for multi-color printing which is free of color drift and Moire effects.

In the first example, the originally employed distortions 2:3/3:2 are combined with a respectively coarser and finer quadratic screen. In FIG. 1, the four configurations are illustrated wherein U indicates the direction on the impression cylinder in the circumferential direction and B indicates the forward feed direction on the engraving element in the axial direction of the cylinders. Corner points of the quadrangles are to be interpreted as the centers of associated raster points. The coarser quadratic raster whose raster points have the spacing of the raster points of the red screen in the U-direction and in the V-direction is advantageously assigned to the yellow color because this generally does not allow the raster structure in the printing to be perceived because of its greater brightness. Red and blue colors are printed in 2:3 or, respectively, 3:2 configuration. The black color has a quadratic raster which is twice as fine as the yellow raster which advantageously benefits the reproduction of fine print. Thus, in FIG. 1 the yellow configuration results in the center of the raster points being on a square which is the square illustrated and indicated as yellow. The red configuration has its circumferential points coincidence with the yellow but its axial direction points are in one-third from the yellow points toward the center of the arrangement. This configuration is indicated with "red" marking. The blue raster points have their axially extending dimensions coincidence with the yellow rasters and their circumferential points in one-third toward the center of the arrangement from the yellow points as illustrated.

Figure 2:
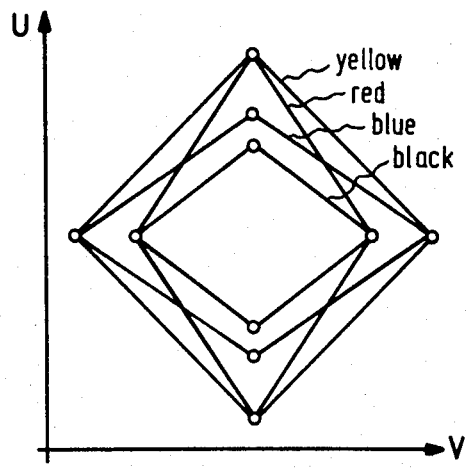
FIG. 2 illustrates a modification of the invention.

A separate embodiment is illustrated in FIG. 2 in which the yellow, red and blue rasters have the same relative positions as in the embodiment illustrated in FIG. 1. However, the black raster points do not lie in the corners of a square as in FIG. 1. Rather, the spacing of the black raster points in the axial direction "V" corresponds to the spacings of the points of the red screen and the spacings in the circumferential direction "U" is equal to one-half the spacing of the red screen in the U-direction.

Other combinations are possible and the important point is that the elongation and compressions in the U or, respectively, V directions need not be precisely observed. Deviations in the magnitude by a few percent are not perceptible in the printed impression. This also applies to the raster amplitudes in the rasters of the individual colors. It is also possible to interchange the colors assigned to the individual rasters. It also is within the teaching of the invention to produce a set of color plates in which a departure from the previous method is made in only one raster and a raster according to the invention is employed only in this particularly separation.

The method can be used not only in engraving of printing forms, but can also be used with the described raster geometries in the production of raster color separations by scanners for all printing methods even as a corresponding contact raster in the classic form production by means of etching in the graphic arts.

The invention is being commercially utilized in the entire range of reproduction technology particularly in electronic reproduction technology.

Although the invention has been described with respect to preferred embodiments, it is not to be so limited as changes and modifications can be made which are within the full intended scope of the invention as defined by the appended claims.

We claim as our invention:

1. A plurality of color screens for multi-color reproduction with a printing machine wherein the raster positions of a first one of said color screens for a first color are spaced a distance M apart in an axial first direction and are spaced a distance M apart in a second direction transverse to the axial direction, the raster positions of a second one of said color screens for a second color are spaced a distance two-third M apart in said first direction and are spaced a distance M apart in said second direction, the raster positions of a third one of said color screens for a third color are spaced a distance M apart in said first direction and are spaced a distance two-thirds M apart in said second direction, and wherein the raster positions of a fourth one of said color screens for a fourth color are spaced a distance one-half M apart in said second direction.

2. A plurality of color screens according to claim 1 wherein the raster positions of the fourth color screen are spaced a distance one-half M apart in said first direction.

3. A plurality of color screens according to claim 1 wherein the raster positions of the fourth color screen are spaced a distance two-thirds M apart in said first direction.

* * * * *